United States Patent
Yamamoto et al.

(10) Patent No.: US 7,612,404 B2
(45) Date of Patent: Nov. 3, 2009

(54) SEMICONDUCTOR DEVICE

(75) Inventors: Akihito Yamamoto, Naka-gun (JP); Masayuki Tanaka, Yokohama (JP); Katsuyuki Sekine, Yokohama (JP); Daisuke Nishida, Yokohama (JP); Ryota Fujisuka, Yokohama (JP); Katsuaki Natori, Yokohama (JP); Hirokazu Ishida, Yokohama (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 11/783,933

(22) Filed: Apr. 13, 2007

(65) Prior Publication Data

US 2007/0241388 A1   Oct. 18, 2007

(30) Foreign Application Priority Data

Apr. 14, 2006   (JP) .............................. 2006-112190

(51) Int. Cl.
*H01L 29/788* (2006.01)
(52) U.S. Cl. .................. 257/321; 257/316; 257/325; 257/E29.3
(58) Field of Classification Search .................. 257/314, 257/315, 288, 324, 325, 334, E29.169, E29.17; 438/201, 211, 257; 365/185.01, 185.18, 365/185.26
See application file for complete search history.

(56) References Cited

U.S. PATENT DOCUMENTS

| | | | |
|---|---|---|---|
| 6,187,632 B1 * | 2/2001 | Shuto et al. .................. 438/257 |
| 6,294,481 B1 * | 9/2001 | Inumiya et al. ............. 438/766 |
| 6,642,568 B2 * | 11/2003 | Narita et al. ................. 257/314 |
| 7,109,549 B2 * | 9/2006 | Ozawa ........................ 257/315 |

(Continued)

FOREIGN PATENT DOCUMENTS

JP    2002-319583    10/2002

(Continued)

OTHER PUBLICATIONS

Notification for Filing Opinion mailed Aug. 22, 2008, from the Korean Patent Offie in counterpart Korean application No. 10-2007-36348 with translation.

(Continued)

*Primary Examiner*—Sue Purvis
*Assistant Examiner*—William Harriston
(74) *Attorney, Agent, or Firm*—Finnegan, Henderson, Farabow, Garrett & Dunner, L.L.P.

(57) ABSTRACT

A semiconductor device includes semiconductor substrate, isolation insulating film, nonvolatile memory cells, each of the cells including tunnel insulating film, FG electrode, CG electrode, interelectrode insulating film between the CG and FG electrodes and including a first insulating film and a second insulating film on the first insulating film and having higher permittivity than the first insulating film, the interelectrode insulating film being provided on a side wall of the floating gate electrode in a cross-section view of a channel width direction of the cell, thickness of the interelectrode insulating film increasing from an upper portion of the side wall toward a lower portion of the side wall, thickness of the second insulating film on an upper corner of the FG electrode being thicker than thickness of the second insulating film on the other portions of the side wall in the cross-section view of the channel width direction.

20 Claims, 7 Drawing Sheets

U.S. PATENT DOCUMENTS

| | | | |
|---|---|---|---|
| 2005/0247973 A1 | 11/2005 | Lee | |
| 2006/0001076 A1* | 1/2006 | Ozawa | 257/315 |
| 2006/0060927 A1 | 3/2006 | Ozawa et al. | |
| 2006/0240619 A1* | 10/2006 | Ozawa et al. | 438/257 |

FOREIGN PATENT DOCUMENTS

| | | |
|---|---|---|
| KR | 10-2004-0002818 | 1/2004 |
| KR | 10-2004-0102343 | 12/2004 |

OTHER PUBLICATIONS

U.S. Appl. No. 11/797,670, filed May 7, 2007, of Akihito Yamamoto et al., entitled "Semiconductor Device and Method for Manufacturing the Same".

* cited by examiner

SEMICONDUCTOR DEVICE

CROSS-REFERENCE TO RELATED APPLICATIONS

This application is based upon and claims the benefit of priority from prior Japanese Patent Application No. 2006-112190, filed Apr. 14, 2006, the entire contents of which are incorporated herein by reference.

BACKGROUND OF THE INVENTION

1. Field of the Invention

The present invention relates to a semiconductor device including an electrically rewritable nonvolatile memory cell.

2. Description of the Related Art

As one of electrically rewritable semiconductor memories, a NAND type flash memory is known. Since the NAND type flash memory is advantageous to miniaturization, its capacitance is being increased.

In order to miniaturize the NAND type flash memory, it is expedient that a tunnel gate insulating film or a gate interelectrode insulating film (hereinafter, IPD film) is thinned. However, it is difficult to proceed the thinning because a data retention characteristic should be secured.

In the case of IPD film, in order to secure a capacitance without the thinning as shown in FIGS. 1A and 1B, a capacitor area is increased by three-dimensional capacitor structure so as to cope with the miniaturization of the NAND type flash memory. FIG. 1A is a cross-section view of a word line direction (channel the second layer width direction), and FIG. 1B is a cross-section view of a direction (channel length direction) perpendicular to the word line direction. In the drawings, 10 designates a silicon substrate, 11 designates an isolation insulating film for trench type isolation (STI), 12 designates a tunnel gate insulating film, 13 designates a source/drain region, 14 designates a floating gate electrode, 15 designates an IPD film, 16 designates a control gate electrode and 17 designates a premetal dielectric film (PMD film).

When the miniaturization is further advanced, as shown in FIGS. 2A and 2B, a space between device elements becomes extremely narrow even in the case where the three-dimensional capacitor structure is adopted. Particularly as is clear from a cross-section view in the word line direction of FIG. 2A, the width of the control gate electrode 16 put into between the floating gate electrodes 14 becomes very small. The control gate electrode 16 is now reaching a geometric limit.

Before reaching the limit, the manufacturing processes such as a process for filling the control gate electrode 16 and a process for processing the control gate electrode 16 become very difficult. As a result, voids are generated in the control gate electrode 16 and thus resistance rises.

When the space between the floating gate electrodes 14 becomes narrow, the control gate electrode 16 becomes thin. Therefore, when the control gate electrode 16 is formed of a polycrystalline silicon film, it is difficult to diffuse sufficient dopant (for example, phosphorus) into the polycrystalline silicon film. Thereby, the function of the control gate is impaired.

When the thinning of the IPD film 15 is realized, it can first reach the limit. However, if leak current passing through the IPD film 15 increases due to the thinning of the IPD film 15, the function of the nonvolatile memory is impaired. Therefore, thin IPD films which can be used as the IPD film 15 are very limited.

An $SiO_2/Si_3N_4/SiO_2$ laminated film (hereinafter, ONO film) is a typical laminated film which is used as the IPD film, but the use of substances having high-permittivity such as $Al_2O_3$ and $HfO_4$ instead of $Si_3N_4$ is proposed (Jpn. Pat. Appln. KOKAI Publication No. 2002-319583). The use of the substances having high-permittivity is effective for extending the limit of miniaturization, namely, for maintaining the capacitance and thinning an average electronically equivalent film thickness. This is not, however, effective for solving difficulty in filling the control gate electrode 16 into a space between the floating gate electrodes 14 which will become further narrower in the future.

BRIEF SUMMARY OF THE INVENTION

According to an aspect of the present invention, there is provided a semiconductor device comprising: a semiconductor substrate; an isolation insulating film provided on the semiconductor substrate; a plurality of nonvolatile memory cells provided on the semiconductor substrate, each of the plurality of nonvolatile memory cells comprising: a tunnel insulating film provided on the semiconductor substrate, a floating gate electrode provided on the tunnel insulating film, a control gate electrode provided above the floating gate electrode, an interelectrode insulating film provided between the control gate electrode and the floating gate electrode and including a first insulating film and a second insulating film provided on the first insulating film and having higher permittivity than the first insulating film, the interelectrode insulating film being provided on a side wall of the floating gate electrode in a cross-section view of a channel width direction of the nonvolatile memory cell, thickness of the interelectrode insulating film increasing from an upper portion of the side wall toward a lower portion of the side wall, thickness of the second insulating film on an upper corner of the floating gate electrode being thicker than thickness of the second insulating film on the other portions of the side wall of the floating gate electrode in the cross-section view of the channel width direction.

According to another aspect of the present invention, there is provided a semiconductor device comprising: a semiconductor substrate; an isolation insulating film provided on the semiconductor substrate; a plurality of nonvolatile memory cells provided on the semiconductor substrate, each of the plurality of nonvolatile memory cells comprising: a tunnel insulating film provided on the semiconductor substrate, a floating gate electrode provided on the tunnel insulating film, a control gate electrode provided above the floating gate electrode, an interelectrode insulating film provided between the control gate electrode and the floating gate electrode and including a first insulating film and a second insulating film provided on the first insulating film and having higher permittivity than the first insulating film, the interelectrode insulating film being provided on a side wall of the floating gate electrode in a cross-section view of a channel width direction of the nonvolatile memory cell, thickness of the interelectrode insulating film increasing from an upper portion of the side wall toward a lower portion of the side wall, the isolation insulating film existing between adjacent floating gate electrodes in the cross-section view of the channel width direction, thickness of the second insulating film on a top surface of the isolation insulating film between the adjacent floating gate electrodes being thinner than thickness of the second insulating film on the other portions.

DETAILED DESCRIPTION OF THE INVENTION

Embodiments of the present invention will be described below with reference to the drawings.

First Embodiment

Figure 1A:
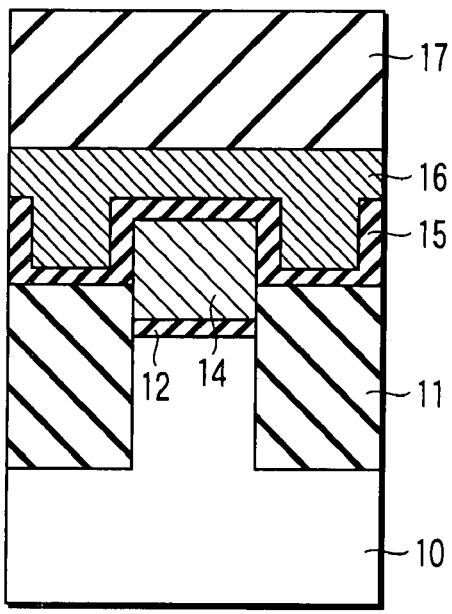
FIGS. 1A and 1B are cross-section views illustrating a flash memory having a three-dimensional capacitor structure.
Figure 1B:
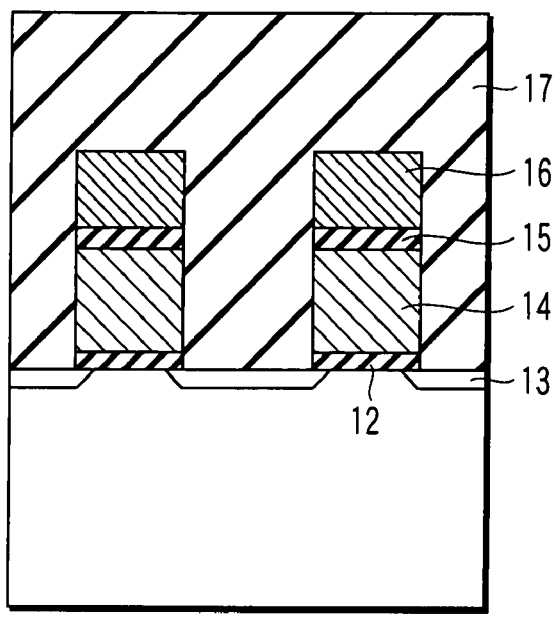
Figure 2A:
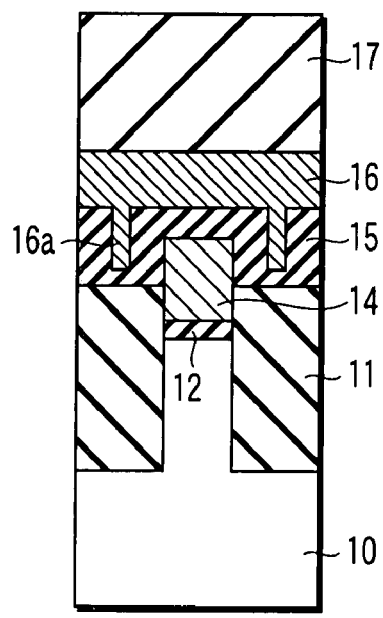
FIGS. 2A and 2B are cross-section views illustrating the miniaturized flash memory of FIG. 1.
Figure 2B:
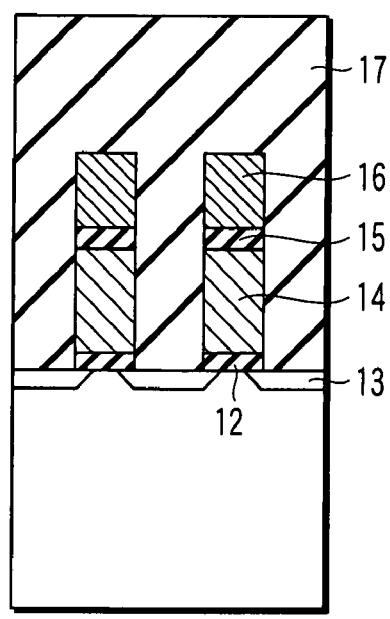
Figure 3:
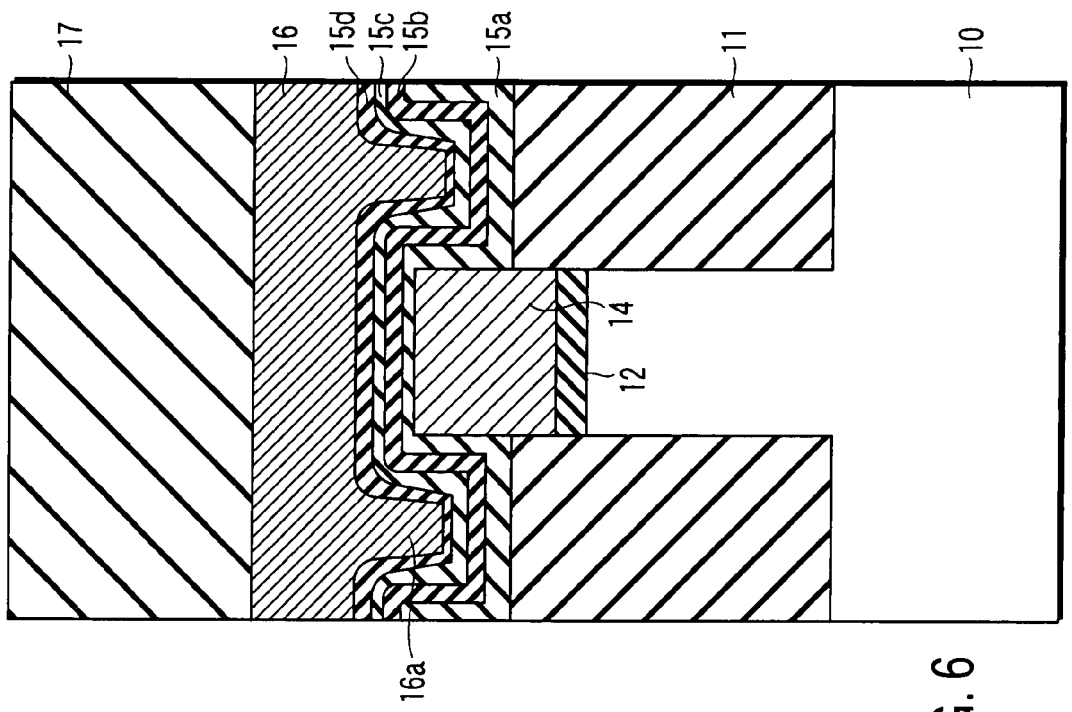
FIG. 3 is a cross-section view explaining a problem examined by the inventors of the present invention.

First, the problems which have been examined by the inventors of the present invention will be described below with reference to FIG. 3. In FIG. 3, an ONO film in which an $SiO_2$ film 15a, an $Si_3N_4$ film 15b and an $SiO_2$ film 15c are laminated in this order is used as an IPD film.

In FIG. 3, the $SiO_2$ films 15a and 15c and the $Si_3N_4$ film 15b are substantially conformal films. That is to say, the $SiO_2$ films 15a and 15c and the $Si_3N_4$ film 15b have approximately the same film thickness on a direct surface (top surface) of a floating gate (FG) electrode 14, on a side wall of the FG electrode 14 and on a direct surface (top surface) of an isolation insulating film 11. When a low pressure CVD (chemical vapor deposition) method is used as a film formation method, the ONO film having such a shape is formed.

A void 31 is generated in a portion 16a of a control gate (CG) electrode 16 sandwiched between the FG electrodes 14. While the void 31 is small, baneful influence is not given to the device element, but, when the void 31 becomes larger, the baneful influence is given to the operation of the device element.

Next, a first embodiment will be described below with reference to FIGS. 4 to 6. The present embodiment refers to a semiconductor device including a NAND type flash memory as an electrically rewritable nonvolatile memory cell.

Figure 4:
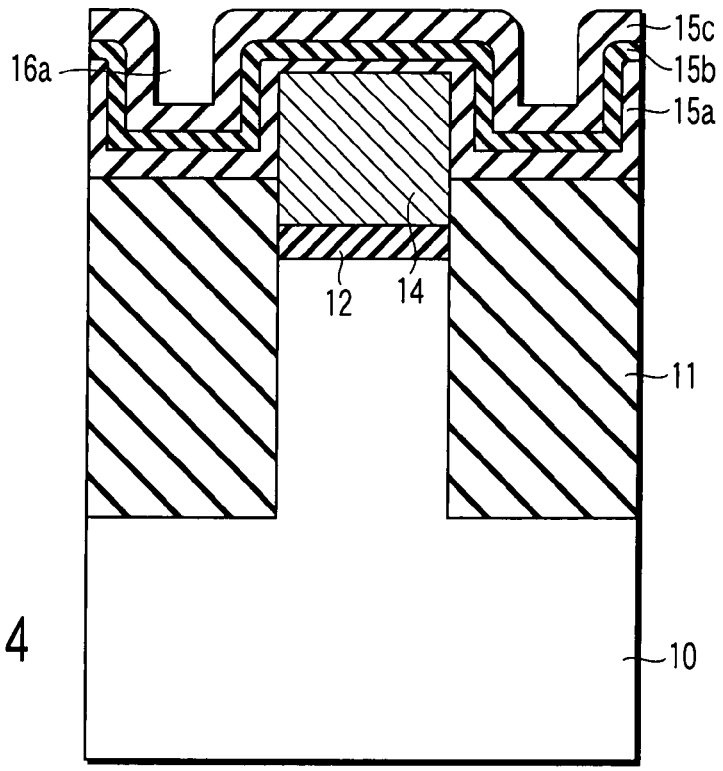
FIG. 4 is a cross-section view illustrating a flash memory manufacturing method according to a first embodiment.

As shown in FIG. 4, the isolation insulating film 11, a tunnel gate insulating film 12 and the FG electrode 14 are formed by conventional method, thereafter, the conformal ONO film (the $SiO_2$ film 15a, the $Si_3N_4$ film 15b and the $SiO_2$ film 15c) is formed on the entire the surface. The FG electrode 14 has a side wall which is perpendicular to a surface of a silicon substrate 10 in a cross section in the channel width direction as shown in FIG. 4.

When the ONO film is formed by low pressure CVD method, the conformal shape shown in FIG. 4 is obtained, but when thermal oxidation or conformal radical oxidation is used for forming the $SiO_2$ film 15c (first insulating film) on the top layer of the ONO film, the similar shape is obtained.

Thereafter $SiO_2$ film 15c on the top layer of the ONO film is nitrided by using plasma nitrogen or radical nitrogen. As to the plasma and radical generating method, the plasma may be generated by using microwave, or a plasma generating apparatus of MHz band may be used. In addition, in order to heighten plasma generating efficiency, inert gas may be added to nitrogen, or mixed gas of $NH_3$ or nitrogen and hydrogen may be brought into a plasma state.

When a plasma source is placed in a position comparatively far from the silicon substrate 10, nitridation species which reaches the silicon substrate 10 is mainly radical components. Therefore, the nitriding is caused in an approximately conformal manner. However, when the silicon substrate 10 is made to be close to the plasma source, the nitriding is started by nitrogen ions generated from the plasma source. Therefore, non-conformal nitriding is caused.

Figure 5:
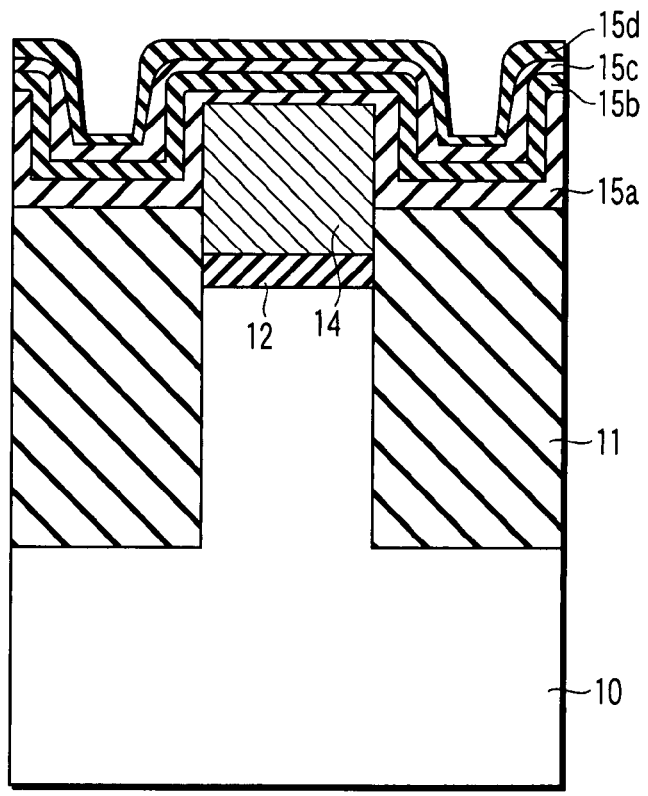
FIG. 5 is a cross-section view illustrating the flash memory manufacturing method following the first embodiment after FIG. 4.

FIG. 5 is a cross-section view illustrating a state after the ONO film is nitrided by using the non-conformal nitriding method. In FIG. 5, 15d designates a nitride film (second insulating film) formed by nitriding.

Figure 6:
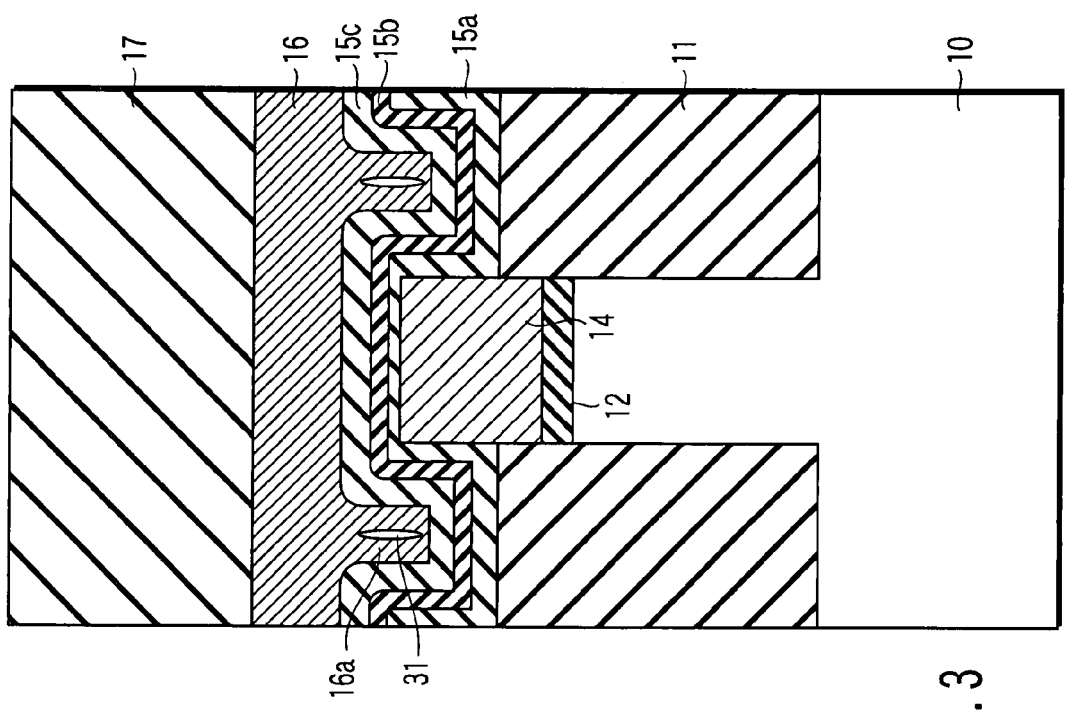
FIG. 6 is a cross-section view illustrating the flash memory manufacturing method following the first embodiment after FIG. 5.

FIG. 6 is a cross-section view illustrating a state after the CG electrode 16 and a PMD film 17 are deposited on the IPD films 15a, 15b and 15c after the non-conformal nitriding process. In the present embodiment, it is found out that the void is not formed in the CG electrode 16.

Figure 7:
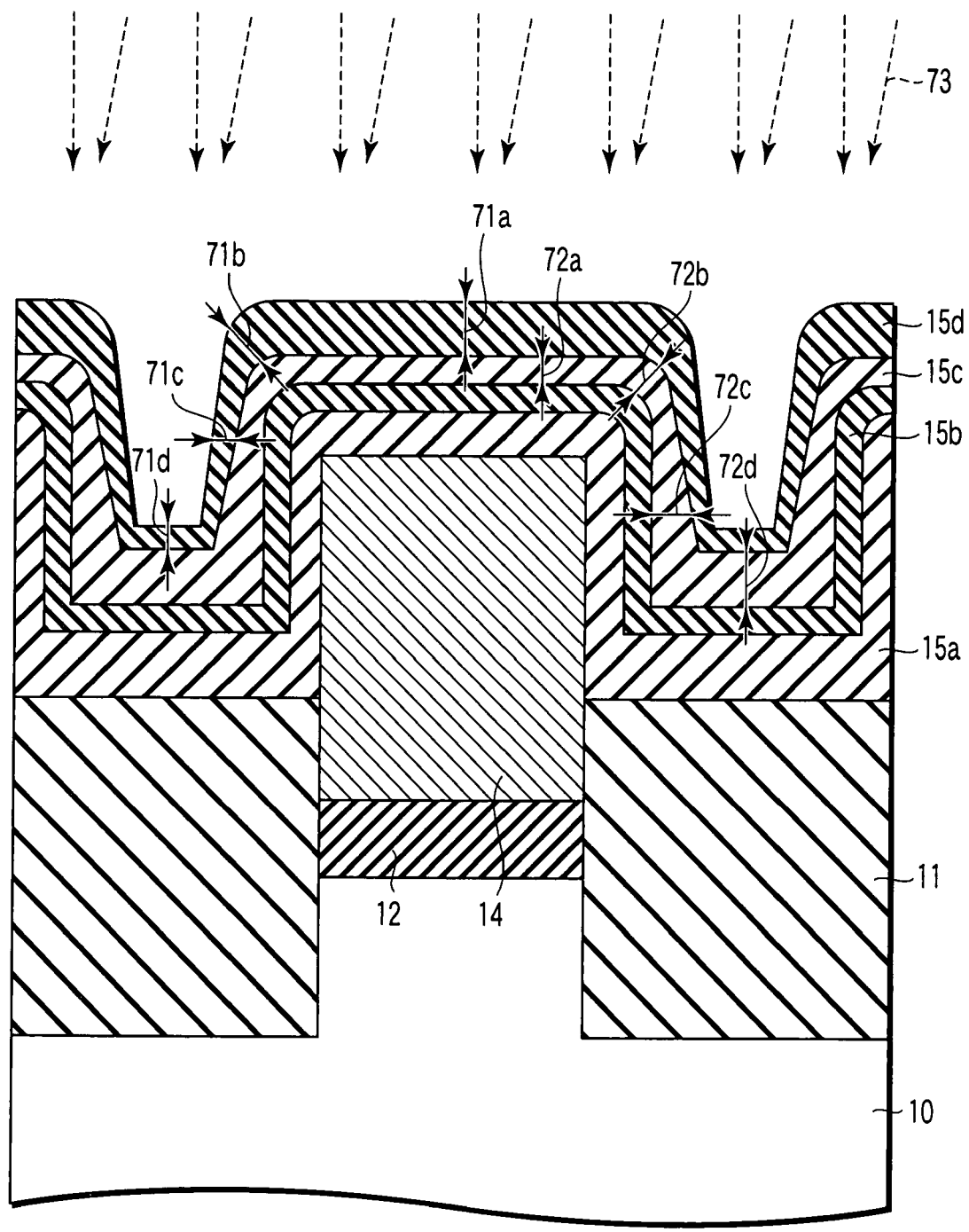
FIG. 7 is a cross-section view explaining a film thickness of a top nitride film and an $SiO_2$ film on a second layer of an IPD film (3rd film from bottom) according to the first embodiment.

FIG. 7 is a cross-section view explaining a film thickness of the nitride film 15d (non-conformal nitride film) on the top layer of the IPD film and a film thickness of the $SiO_2$ film 15c on the second layer of the IPD film of the present embodiment.

In FIG. 7, 71a designates a film thickness (nitride film thickness) of the nitride film 15d above the FG electrode 14, and 71b designates a film thickness (nitride film thickness) of the nitride film 15d on an upper corner portion of the FG electrode 14. 71c designates a film thickness (nitride film thickness) of the nitride film 15d on the side wall of the FG electrode 14, and 71d designates a film thickness (nitride film thickness) of the nitride film 15d on the direct surface (top surface) of the isolation insulating film 11.

Although the nitride film thickness 71a is approximately equal to the nitride film thickness 71b, the nitride film thicknesses 71c and 71d are thinner than the nitride film thicknesses 71a and 71b. As shown in FIG. 7, since the nitride species 73 is supplied from above, the nitride specifies 73 is consumed on the upper side. As a result, the nitride film thicknesses are distributed in such a manner.

On the other hand, since oxygen of the $SiO_2$ film 15c on the upper layer of the ONO film is converted into nitrogen so that nitriding is caused, the thickness of the residual $SiO_2$ film 15c becomes thin on a portion nitrided a lot. That is to say, in FIG. 7, a film thickness (oxide film thickness) 72a of the $SiO_2$ film 15c above the FG electrode 14 is approximately equal to a film thickness (oxide film thickness) 72b of the $SiO_2$ film 15c on the upper corner portion of the FG electrode 14, but, a film thickness (oxide film thickness) 72c of the $SiO_2$ film 15c on the side wall of the FG electrode 14 and a film thickness (oxide film thickness) 72d of the $SiO_2$ film 15c on the direct surface (top surface) of the isolation insulating film 11 are thicker than the oxide film thicknesses 72a and 72b.

Further, when $SiO_2$ (oxide) is converted into $Si_3N_4$ (nitride) by nitriding, volume of $Si_3N_4$ (nitride) becomes smaller than volume of $SiO_2$ (oxide). Therefore, a total film thickness of the film thickness of the nitride film 15d and the film thickness of $SiO_2$ film 15c after the nitriding in FIG. 7 becomes smaller than the original film thickness of the $SiO_2$ film 15c in FIG. 4. In addition, as the nitriding proceeds further, the total film thickness becomes smaller.

Figure 8:
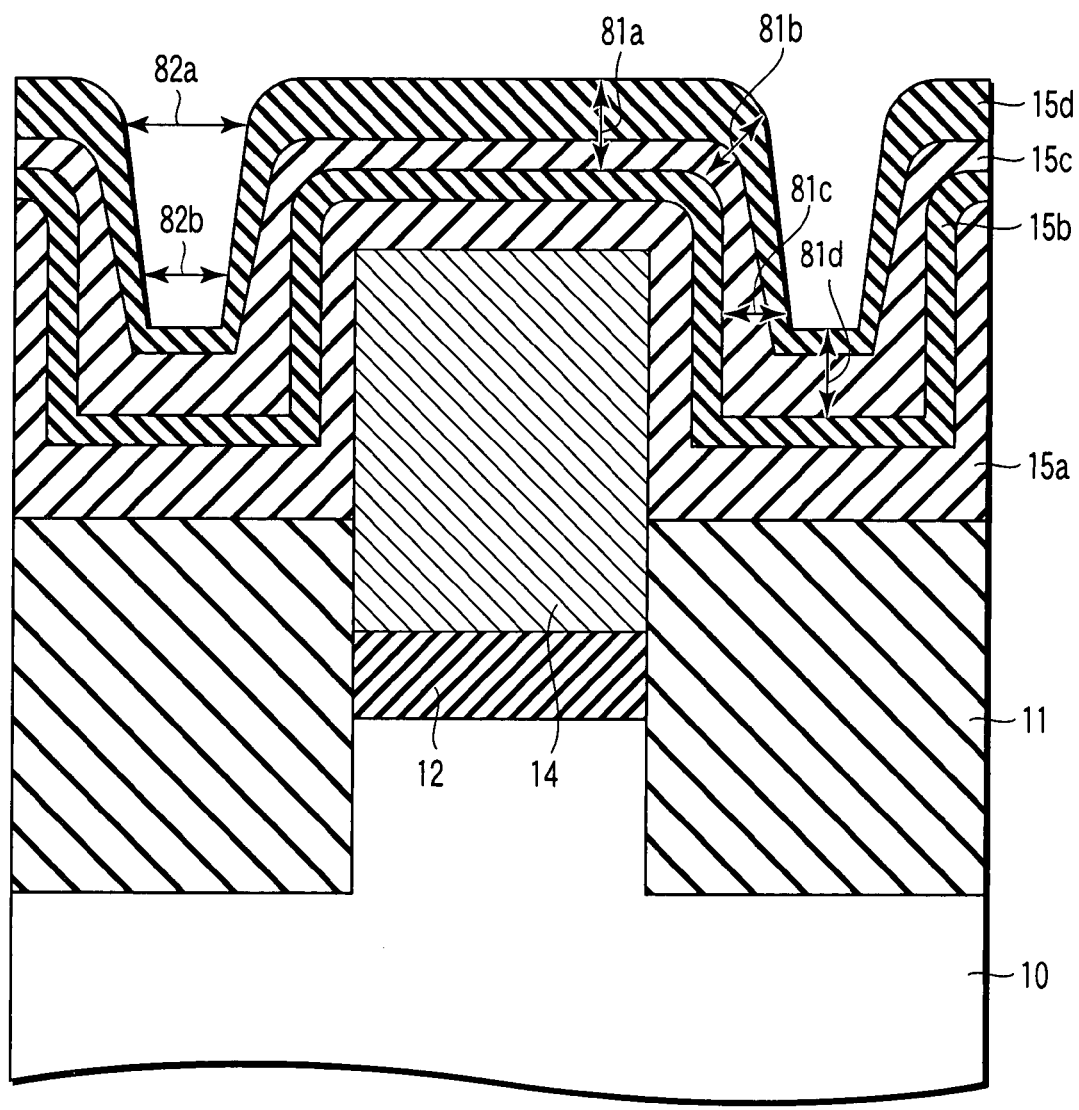
FIG. 8 is a cross-section view explaining distribution of a total film thickness of the nitride film and the $SiO_2$ film of the IPD film according to the first embodiment.

FIG. 8 illustrates a variation in the total film thickness of the film thickness of the nitride film 15d and the film thickness of the upper-layer film ($SiO_2$ film 15c) of the ONO film among different places. Still more, since the films 15a and 15b forming the IPD film other than the nitride film 15d and the $SiO_2$ film 15c are the conformal films, the variation in the total film thickness among different positions is applied also to the entire film thickness of the IPD film.

A total film thickness 81a on the direct surface (top surface) of the FG electrode 14 is approximately equal to a total film thickness 81b on the upper corner portion of the FG electrode 14.

A total film thickness 81c on the side surface of the FG electrode 14 and a total film thickness 81d on the direct surface (top surface) of the isolation insulating film 11 are larger than the total film thicknesses 81a and 81b. As a result, an opening 82a of a gap between the FG electrodes 14 becomes wider than a deep portion 82b of the gap. This shape is very advantageous to the case where the gap between the FG electrodes 14 is filled at the successive step of forming the CG electrode 16.

As is seen from FIG. 7, the film thickness 71d of the nitride film 15 on the top surface of the isolation insulating film 11 is thinner than the film thickness 71a of the nitride film 15d on the top surface of the FG electrode 14. This means that the capacitance between the device elements (FG electrodes) can be reduced further than the case where a conformal nitride film is used. It also shows that the non-conformal nitriding process (non-conformal nitride film) using plasma and radical of the present embodiment is found out to be excellent.

In addition, dependence properties of the thicknesses of the nitride film 15d on places (distribution of the film thicknesses), namely, The control of the nitride film thicknesses 71a to 71d in FIG. 7 can be performed by adjusting a plasma condition, a distance between the plasma and the silicon substrate 10 or the like. In general, the ion components are increased by reducing pressure, so that the nitriding amount on the upper portion can be increased. In addition, anisotropy can be strengthened by applying a bias to a stage for holding the silicon substrate 10.

Figure 9:
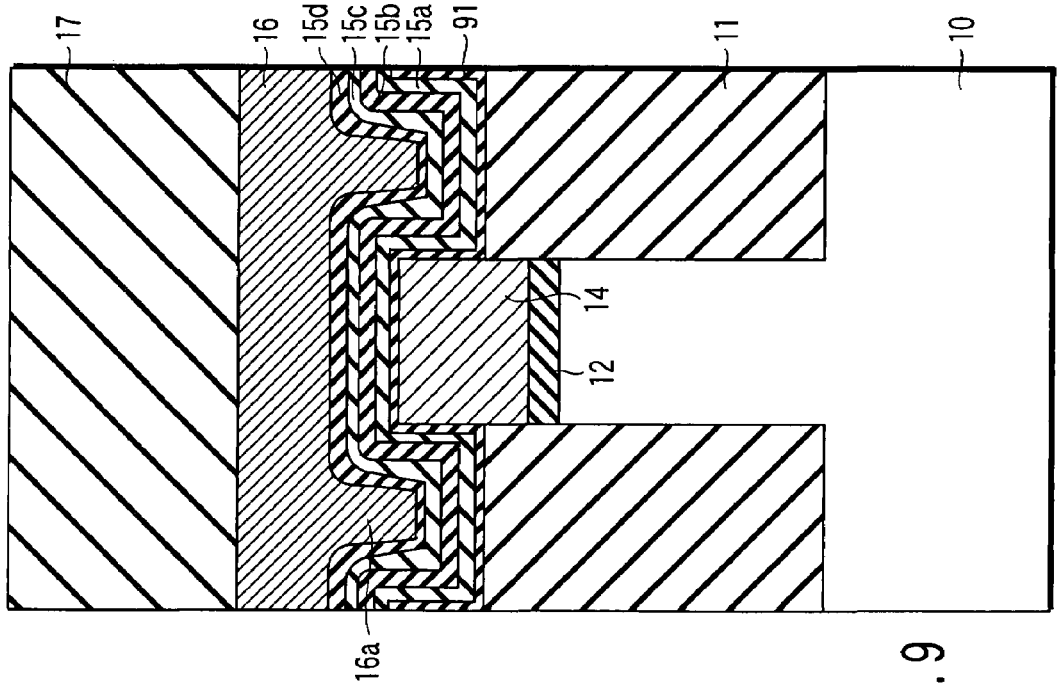
FIG. 9 is a cross-section view explaining a modified example of the first embodiment.

The above description has detailed the example where the ONO film is nitrided, but as shown in FIG. 9, the first layer of the IPD film may be formed of an $Si_3N_4$ film 91, namely, an NONO structure may be nitrided. In this case, the final structure is an NONON structure.

In addition, the above description refers to the nitride film formed of stoichiometric $Si_3N_4$, but the nitride film may be shifted from stoichiometry. In addition, oxynitride such as $SiO_xN_y$ may be used. Depending on the depth, when the oxide film is nitrided, oxynitride is formed on a lot of portions.

Figure 10:
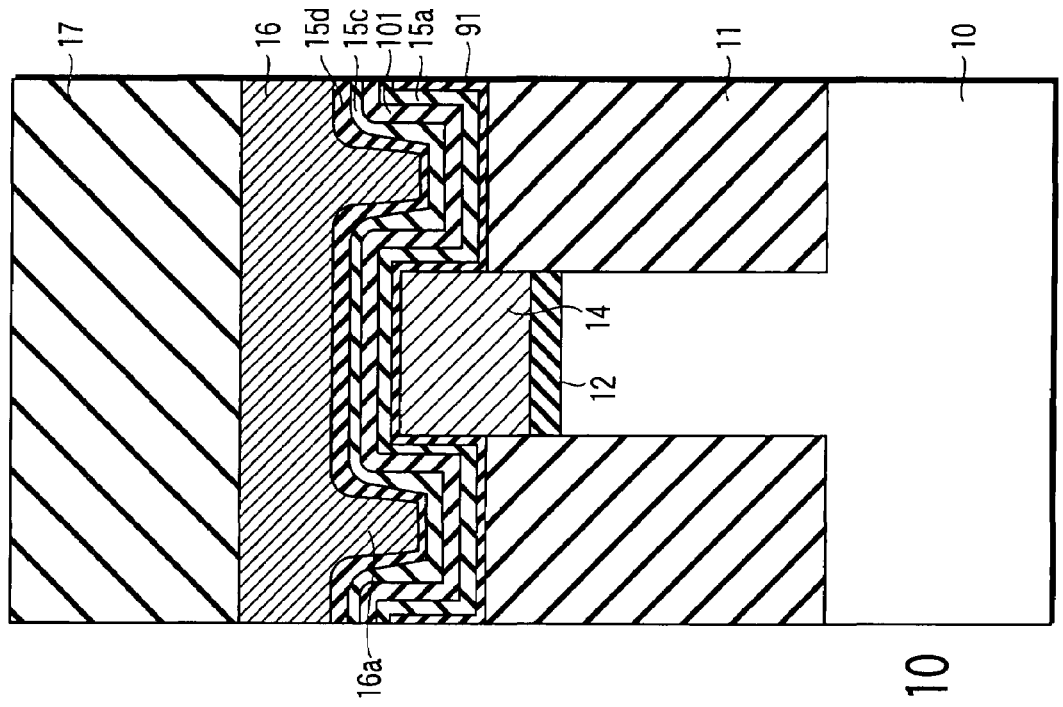
FIG. 10 is a cross-section view explaining another modified example of the first embodiment.

In addition, as shown in FIG. 10, a substance, whose permittivity is higher than the permittivity of silicon nitride, such as $Al_2O_3$, $HfO_4$ or La oxide and their mixture may be used for a center portion 101 of the IPD film.

Second Embodiment

A second embodiment will be described with reference to FIGS. 11 and 12. In the following figures, the portions corresponding to the portions shown in the previously mentioned drawings are denoted by the same reference numerals and omitted its detail explanation.

Figure 11:
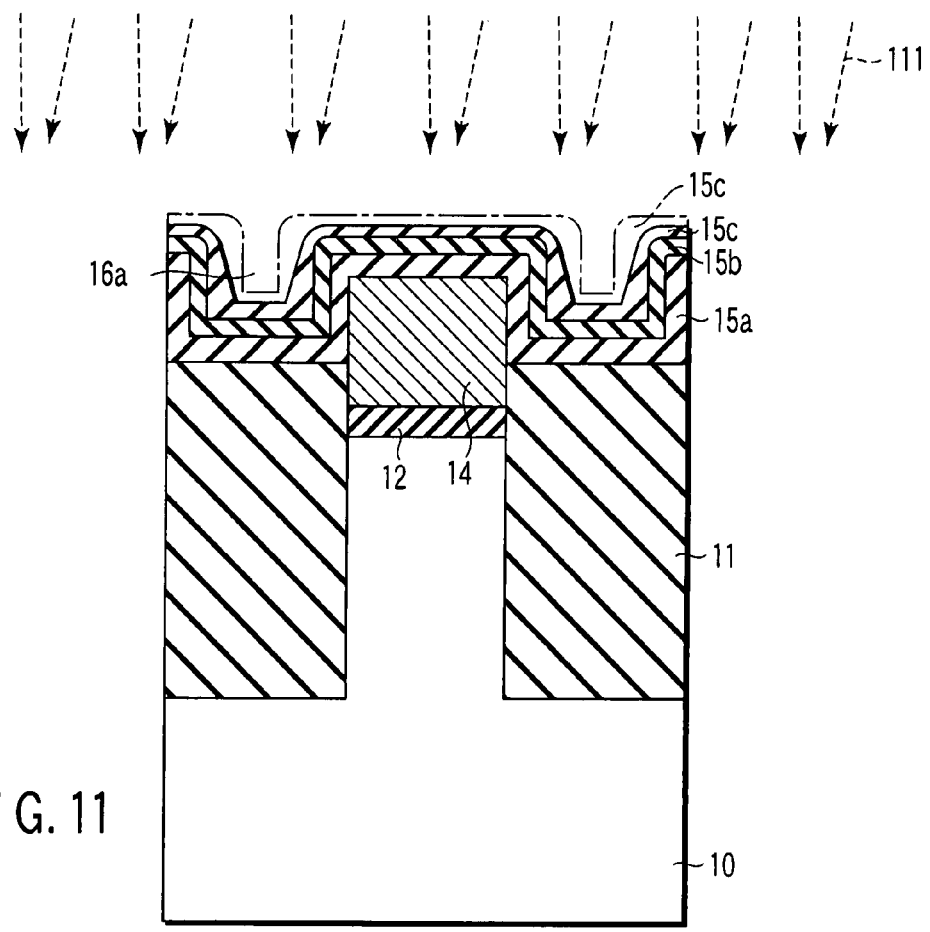
FIG. 11 is a cross-section view illustrating a flash memory manufacturing method according to a second embodiment.

After the ONO films 15a to 15c shown in FIG. 4 are formed, as shown in FIG. 11, anisotropic dry etching is performed to the ONO films 15a to 15c. In the drawings, 111 designates etching species such as $CF_4$ for $SiO_2$ (oxide).

In FIG. 11, the $SiO_2$ film 15c as the upper layer of the ONO film before the etching is shown by one-dot broken line, and the $SiO_2$ film 15c after the etching is shown by a solid line. Even with the anisotropic etching, oblique etching occurs, and thus the etching on the upper corner portion of the $SiO_2$ film 15c proceeds preferentially to some extent, as a result, the $SiO_2$ film 15c having the shape shown by the solid line is obtained.

Figure 12:
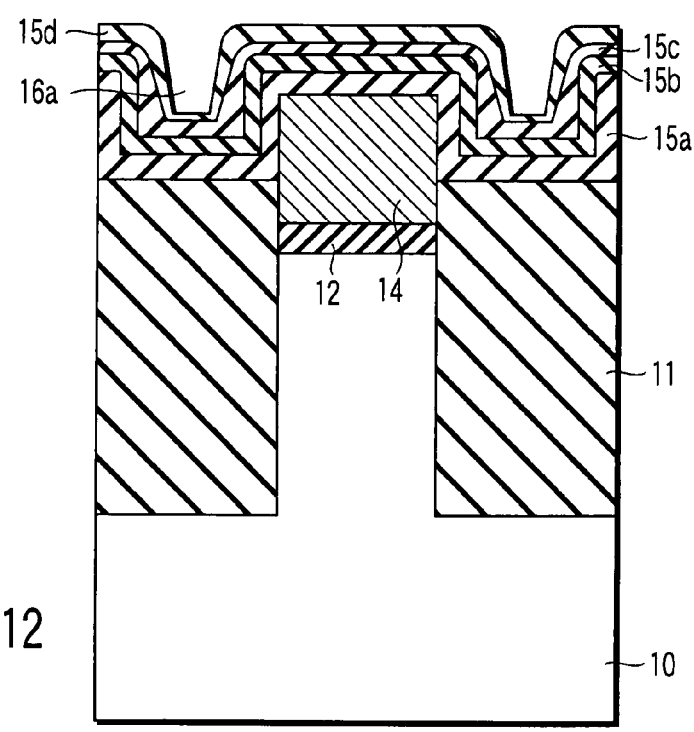
FIG. 12 is a cross-section view illustrating the flash memory manufacturing method following the second embodiment after FIG. 12.

Next as shown in FIG. 12, the non-conformal nitride film 15d is formed. Thereby, the IPD film having the film thickness distribution similar to that in the first embodiment can be obtained, and the similar effect as the first embodiment is obtained.

Various effects which are produced by place dependence property (film thickness distribution) of the thicknesses of the insulating films forming the IPD film in the embodiments will be described clearly below based on the embodiments.

First, the non-conformal silicon nitride film on the top layer of the IPD film will be described.

(1) The nitride film thickness 71d on the direct surface (top surface) of the isolation insulating film 11 is thinner than the nitride film thicknesses 71a and 71b on the other portions. Thereby, the parasitic capacitance between the device elements adjacent to each other in the word line direction is reduced, so that a false operation of the memory device due to the interference so called adjacent device elements betweenness interference can be avoided. This effect is noticeable when the top layer is the insulating film made of a material whose permittivity is higher than the permittivity of the silicon oxide film on the second layer. That is to say, this effect is noticeable not only in the case of the combination of the silicon nitride film and the silicon oxide film but also in the case of the combination of other insulating films (materials) as long as the top layer has the permittivity higher than the permittivity of the second layer from top layer.

(2) The nitride film thickness 71b on the upper corner portion of the FG electrode 14 is thicker than the nitride film thicknesses 71c and 71d on the other portions. Thereby, concentration of electric fields is reduced on the upper corner portion of the FG electrode 14 where the electric field increases the most due to a curvature shape, and thus an increase in a leak current due to the concentration of the electric field is suppressed, and thus a charge retention property of the memory device is improved. Relating to this effect, it is desirable that the top layer is the insulating film made of a material whose permittivity is higher than the permittivity of the silicon oxide film of the second layer, because the electric discharge is prevented by increasing the physical film thickness while the electric capacitance of the IPD film is being secured. That is to say, it is desirable for this effect that not only the combination of the silicon nitride film and the silicon oxide film but also the combination of other insulating films (materials) are used as long as the top layer may be the insulating film whose permittivity is higher than the permittivity of the second layer.

(3) The nitride film thickness 71c on the side wall of the FG electrode 14 is thinner than the nitride film thicknesses 71a and 71b on the other portions. Thereby, in the case where the isolation insulating film 11 is the silicon nitride film, when the control gate is subject to the RIE process parallel to the word line direction, remaining of the silicon nitride film 15d having selectivity hard to be obtained is hardly generated, and thus dispersion of the finished shape of the memory element between the device elements can be reduced (the dispersion of the characteristic of the memory device can be reduced). This effect is noticeable when the top layer is the insulating film made of a material where etching is more difficult than the silicon oxide film on the second layer. That is to say, this effect is noticeable not only in the case of the combination of the silicon nitride film and the silicon oxide film but also in the case of the combination of other insulating films (materials) as long as the etching of the top layer is more difficult than the etching of the second layer.

Next, the silicon oxide film on the second layer having the film thickness distribution will be described below.

The oxide film thickness 72c on the side wall of the FG electrode 14 is thicker than the oxide film thickness 72a on the direct surface (top surface) of the FG electrode 14. Thereby, even if the depth of the CG electrode 16 to be filled between the adjacent FG electrodes 14 differs between the device elements, the dispersion of the electric capacitance of the IPD film between the device elements can be suppressed (the characteristic dispersion of the memory device can be suppressed). This effect is noticeable when the second layer is an insulating film made of a material having lower permittivity than the permittivity of the silicon nitride film on the top layer. That is to say, this effect is noticeable not only in the case of the combination of the silicon nitride film and the silicon oxide film but also in the case of the combination of other insulating films (materials) as long as the second layer is an insulating film having lower permittivity than the permittivity of the insulating film on the top layer.

And as to the total film thickness of the top layer and the second layer, as the total film thickness 81c on the side wall of the FG electrode 14 becomes gradually thicker from the upper portion towards the lower portion, the CG electrode 16 can be formed easily between the adjacent FG electrodes 14. Thereby, a void generated in the CG electrode 16 can be suppressed. Further, in the case where the CG electrode 16 is formed of a polycrystalline silicon film, lowering of dopant concentration can be suppressed. That is to say, when the CG electrode 16 is formed of polycrystalline silicon, it is desirable that the dopant is distributed in the entire CG electrode 16, the use of the method for forming the IPD film of the embodiment enables more uniform diffusion when the dopant is redistributed by diffusion method. Particularly when an average size of polycrystalline particles becomes larger than the size on the portion sandwiched between the floating gates, the lowering of the dopant concentration can be suppressed more effectively. Since these effects are determined by a geometric shape, the insulating films (materials) of the top and second layers are not particularly limited.

The above description does not refer to the concrete film thicknesses of a cell size, but when the film thickness of the cell size is 100 nm or less, particularly, 50 nm or less, it is considered that the IPD film according to the present invention produces the effects advantageous over conventional IPD films. This is because when the cell size is 100 nm or less, particularly, 50 nm or less, it is difficult to fill the CG electrode between the IPDs.

The present invention is not limited directly to the above embodiments. For example, while the above embodiments describe the case where the silicon substrate is used, an SOI substrate and a semiconductor substrate including SiGe in an active region, for example, may be used.

The above embodiments describe the NAND type flash memory as the nonvolatile memory cell, but the present invention can be also applied to another nonvolatile memory cells having an FG electrode and a CG electrode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an isolation insulating film provided on the semiconductor substrate;
   a plurality of nonvolatile memory cells provided on the semiconductor substrate,
   each of the plurality of nonvolatile memory cells comprising:
   a tunnel insulating film provided on the semiconductor substrate,
   a floating gate electrode provided on the tunnel insulating film,
   a control gate electrode provided above the floating gate electrode,
   an interelectrode insulating film provided between the control gate electrode and the floating gate electrode and including a first insulating film and a second insulating film provided on the first insulating film and having higher permittivity than the first insulating film, the interelectrode insulating film being provided on a side wall of the floating gate electrode in a cross-section view of a channel width direction of the nonvolatile memory cell, thickness of the interelectrode insulating film increasing from an upper portion of the side wall toward a lower portion of the side wall, thickness of the second insulating film on an upper corner of the floating gate electrode being thicker than thickness of the second insulating film on the other portions of the side wall of the floating gate electrode in the cross-section view of the channel width direction.

2. The semiconductor device according to claim 1, wherein the isolation insulating film exists between adjacent floating gate electrodes in the cross-section view of the channel width direction, thickness of the second insulating film on a top surface of the isolation insulating film between the adjacent floating gate electrodes is thicker than thickness of the second insulating film on the other portions.

3. A semiconductor device comprising:
   a semiconductor substrate;
   an isolation insulating film provided on the semiconductor substrate;
   a plurality of nonvolatile memory cells provided on the semiconductor substrate,
   each of the plurality of nonvolatile memory cells comprising:
   a tunnel insulating film provided on the semiconductor substrate,
   a floating gate electrode provided on the tunnel insulating film,
   a control gate electrode provided above the floating gate electrode,
   an interelectrode insulating film provided between the control gate electrode and the floating gate electrode and including a first insulating film and a second insulating film provided on the first insulating film and having higher permittivity than the first insulating film, the interelectrode insulating film being provided on a side wall of the floating gate electrode in a cross-section view of a channel width direction of the nonvolatile memory cell, thickness of the interelectrode insulating film increasing from an upper portion of the side wall toward a lower portion of the side wall, the isolation insulating film existing between adjacent floating gate electrodes in the cross-section view of the channel width direction, thickness of the second insulating film on a top surface of the isolation insulating film between the adjacent floating gate electrodes being thinner than thickness of the second insulating film on the other portions.

4. The semiconductor device according to claim 1, wherein the floating gate electrode includes a side wall perpendicular to a surface of the semiconductor substrate in the cross-section view of the channel width direction.

5. The semiconductor device according to claim 2, wherein the floating gate electrode includes a side wall perpendicular to a surface of the semiconductor substrate in the cross-section view of the channel width direction.

6. The semiconductor device according to claim 3, wherein the floating gate electrode includes a side wall perpendicular to a surface of the semiconductor substrate in the cross-section view of the channel width direction.

7. The semiconductor device according to claim 1, wherein the first insulating film is a silicon oxide film, the second insulating film is a silicon nitride film of a top layer of the interelectrode insulating film.

8. The semiconductor device according to claim 2, wherein the first insulating film is a silicon oxide film, the second insulating film is a silicon nitride film of a top layer of the interelectrode insulating film.

9. The semiconductor device according to claim 3, wherein the first insulating film is a silicon oxide film, the second insulating film is a silicon nitride film of a top layer of the interelectrode insulating film.

10. The semiconductor device according to claim 4, wherein the first insulating film is a silicon oxide film, the second insulating film is a silicon nitride film of a top layer of the interelectrode insulating film.

11. The semiconductor device according to claim 1, wherein the first insulating film includes a first silicon oxide film, a first silicon nitride film on the first silicon oxide film and a second silicon oxide film on the first silicon nitride film, the second insulating film is a second silicon nitride film on the second silicon oxide film.

12. The semiconductor device according to claim 11, wherein a film thickness of the second silicon nitride film above the floating gate electrode is approximately equal to a film thickness of the second silicon nitride film on an upper corner portion of the floating gate electrode, a film thickness of the second silicon nitride film on the other portions of the side wall of the floating gate electrode and a film thickness of the second silicon nitride film on a top surface of the isolation insulating film are thinner than the film thickness of the second silicon nitride film above the floating gate electrode and the film thickness of the second silicon nitride film on the upper corner portion of the floating gate electrode.

13. The semiconductor device according to claim 11, wherein a film thickness of the second silicon oxide film above the floating gate electrode is approximately equal to a film thickness of the second silicon oxide film on an upper corner portion of the floating gate electrode, a film thickness of the second silicon oxide film on the other portions of the side wall of the floating gate electrode and a film thickness of the second silicon oxide film on the top surface of the isolation insulating film are thicker than the film thickness of the second silicon oxide film above the floating gate electrode and the film thickness of the second silicon oxide film on the upper corner portion of the floating gate electrode.

14. The semiconductor device according to claim 11, wherein the first insulating film further includes a third silicon nitride film provided under the first silicon oxide film.

15. The semiconductor device according to claim 11, wherein the interelectrode insulating film further includes a substance having higher permittivity than silicon nitride.

16. The semiconductor device according to claim 1, wherein the plurality of nonvolatile memory cells are 100 nm or less in size.

17. The semiconductor device according to claim 3, wherein the first insulating film includes a first silicon oxide film, a first silicon nitride film on the first silicon oxide film and a second silicon oxide film on the first silicon nitride film, the second insulating film is a second silicon nitride film on the second silicon oxide film.

18. The semiconductor device according to claim 16, wherein a film thickness of the second silicon nitride film above the floating gate electrode is approximately equal to a film thickness of the second silicon nitride film on an upper corner portion of the floating gate electrode, a film thickness of the second silicon nitride film on the other portions of the side wall of the floating gate electrode and a film thickness of the second silicon nitride film on a top surface of the isolation insulating film are thinner than the film thickness of the second silicon nitride film above the floating gate electrode and the film thickness of the second silicon nitride film on the upper corner portion of the floating gate electrode.

19. The semiconductor device according to claim 17, wherein a film thickness of the second silicon oxide film above the floating gate electrode is approximately equal to a film thickness of the second silicon oxide film on an upper corner portion of the floating gate electrode, a film thickness of the second silicon oxide film on the other portions of the side wall of the floating gate electrode and a film thickness of the second silicon oxide film on the top surface of the isolation insulating film are thicker than the film thickness of the second silicon oxide film above the floating gate electrode and the film thickness of the second silicon oxide film on the upper corner portion of the floating gate electrode.

20. The semiconductor device according to claim 3, wherein the plurality of nonvolatile memory cells are 100 nm or less in size.

* * * * *

UNITED STATES PATENT AND TRADEMARK OFFICE
CERTIFICATE OF CORRECTION

| | | |
|---|---|---|
| PATENT NO. | : 7,612,404 B2 | Page 1 of 1 |
| APPLICATION NO. | : 11/783933 | |
| DATED | : November 3, 2009 | |
| INVENTOR(S) | : Yamamoto et al. | |

It is certified that error appears in the above-identified patent and that said Letters Patent is hereby corrected as shown below:

Title page, item (75), line 5, change "Fujisuka," to --Fujitsuka,--

Signed and Sealed this

Nineteenth Day of January, 2010

David J. Kappos
*Director of the United States Patent and Trademark Office*